(12) United States Patent
Ohuchi (10) Patent No.: US 8,013,415 B2
(45) Date of Patent: Sep. 6, 2011

(54) SEMICONDUCTOR DEVICE HAVING A CIRCULAR-ARC PROFILE ON A SILICON SURFACE

(75) Inventor: Masahiko Ohuchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 325 days.

(21) Appl. No.: 11/790,996

(22) Filed: Apr. 30, 2007

(65) Prior Publication Data

US 2007/0252235 A1 Nov. 1, 2007

(30) Foreign Application Priority Data

May 1, 2006 (JP) ................................. 2006-127349

(51) Int. Cl.
*H01L 21/70* (2006.01)
(52) U.S. Cl. ................ 257/499; 257/374; 257/E21.645; 257/E21.646; 257/501; 257/506
(58) Field of Classification Search ........... 257/315, 257/2, E21.646, E21.647, 499, 501, 506, 257/374, E21.645–647; 438/221, 253, 197
See application file for complete search history.

(56) References Cited

U.S. PATENT DOCUMENTS

| | | | | |
|---|---|---|---|---|
| 5,468,675 A | * | 11/1995 | Kaigawa | 438/443 |
| 5,468,676 A | * | 11/1995 | Madan | 438/426 |
| 2002/0064912 A1 | * | 5/2002 | Komori | 438/221 |
| 2002/0135041 A1 | * | 9/2002 | Kunikiyo | 257/510 |
| 2004/0053465 A1 | * | 3/2004 | Hong | 438/253 |
| 2005/0145921 A1 | * | 7/2005 | Chang et al. | 257/315 |
| 2005/0164438 A1 | * | 7/2005 | Okonogi et al. | 438/197 |
| 2005/0265068 A1 | * | 12/2005 | Takemura et al. | 365/149 |
| 2005/0266646 A1 | * | 12/2005 | Goo et al. | 438/296 |
| 2006/0118855 A1 | * | 6/2006 | Lee et al. | 257/315 |
| 2006/0151771 A1 | * | 7/2006 | Asano et al. | 257/2 |
| 2007/0026603 A1 | * | 2/2007 | Lee et al. | 438/250 |

FOREIGN PATENT DOCUMENTS

| | | | |
|---|---|---|---|
| JP | 05-299497 | * | 11/1993 |
| JP | 2000-58635 | | 2/2000 |
| JP | 2000-058635 | * | 2/2000 |
| JP | 2001-35913 | | 2/2001 |

OTHER PUBLICATIONS

Japanese Office Action dated May 12, 2008 with Partial English Language Translation.

* cited by examiner

*Primary Examiner* — Lynne A Gurley
*Assistant Examiner* — Galina Yushina
(74) *Attorney, Agent, or Firm* — McGinn IP Law Group, PLLC (57) ABSTRACT

A semiconductor device includes a shallow isolation trench (STI) structure on a silicon substrate for isolating element-forming regions from one another. The surface region of the silicon substrate in the element-forming regions, as viewed in the extending direction of the gate electrode lines, once falls and thereafter rises monotonically from the periphery toward the center of the element-forming regions.

22 Claims, 10 Drawing Sheets

RELATED ART

RELATED ART

FIG. 11

RELATED ART

SEMICONDUCTOR DEVICE HAVING A CIRCULAR-ARC PROFILE ON A SILICON SURFACE

This application is based upon and claims the benefit of priority from Japanese patent application No. 2006-127349 filed on May 1, 2006, the disclosure of which is incorporated herein in its entirety by reference.

BACKGROUND OF THE INVENTION

1. Field of the Invention

The present invention relates to a semiconductor device and a method for manufacturing the semiconductor device, and more particularly to a semiconductor device including therein MIS (Metal Insulator Semiconductor) transistors and a method for manufacturing the same.

2. Description of the Related Art

Semiconductor memory devices such as a DRAM (Dynamic Random Access Memory) device incorporate therein capacitors as storage elements and MOS (Metal Oxide Semiconductor) transistors for driving the capacitors. Reduction in the design rule of the semiconductor memory devices has recently been accelerated, which reduces the device area occupied by the MOS transistors, with the result that a sufficient gate width is difficult to secure. The reduction in the gate width causes a decrease in the ON-current of the MOS transistors, thereby inducing a reduction in the S/N ratio of the DRAM device.

There is known a vertical-type MOS transistor as a MIS transistor capable of securing a larger gate width with a smaller occupied area, in which source and drain regions and gate electrodes are arranged in a three-dimensional structure. To form the vertical-type MOS transistor, however, additional processes must be performed of obtain the three-dimensional structure, and thus the number of the processes increases considerably as compared with the planar-type MOS transistor. In such circumstances, there is an increasing demand for a semiconductor memory device that achieves a low fabrication cost in forming the planar-type MOS transistor, while securing a sufficient gate width without an increase in the number of processes.

Figure 11:
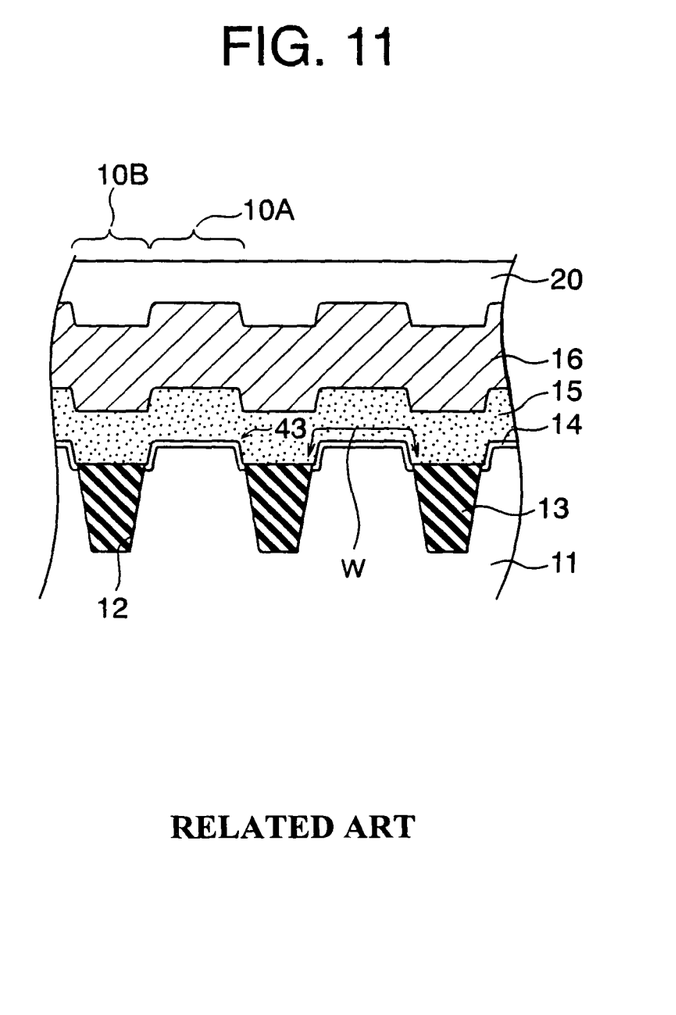
FIG. 11 is a sectional view showing the configuration of a conventional semiconductor device.

Patent Publication JP-2001-035913A describes a planar-type MOS transistor, such as shown in FIG. 11 of the accompanying drawings. The process for forming the planar-type MOS transistor includes the steps of forming element-isolating region 10B on a silicon substrate 11, known as a STI (Shallow Trench Isolation) structure, and removing the surface portion of the isolation oxide film 13 embedded in the trench 12 of the element-isolation region 10B. The removal of the surface portion of the isolation oxide film 13 generates a step difference between the top surface of the silicon substrate 11 configuring the element-forming regions 10A and the surface of the isolation oxide film 13 in the element-isolation region 10B.

In JP-2001-035913A, the formation of the step difference between the top surface of the silicon substrate 11, i.e., the element-forming regions 10A and the top surface of the isolation oxide film 13 in the element-isolation region 10B prolongs the length of the surface area of the silicon surface at the location of the step difference, which results in an increase of the gate width denoted by "W" in FIG. 11.

In the method described in JP-2001-035913A; however, a corner edge 43 may be formed on the edge of the surface region of the silicon substrate 11 in the element-forming regions 10A, as shown in FIG. 11. The corner edge 43 may cause a concentration of electric field onto a portion of the gate oxide film 14 during dry etching of a conductor film to form the gate electrodes 15. The concentration of the electric field may etch the gate oxide film 14 in an excessive amount to reduce the thickness of the gate oxide film 14. A smaller thickness of the gate oxide film 14 causes a smaller withstand voltage thereof, to degrade the reliability of the MOS transistor.

SUMMARY OF THE INVENTION

It is an object of the present invention to provide a semiconductor device including MIS transistors having a larger gate width without causing degradation in the reliability of the MIS transistors.

It is another object of the present invention to provide a method for manufacturing the semiconductor device as described above.

The present invention provides, in a first aspect thereof, a semiconductor device including: a silicon substrate; an element isolation region including a trench formed in the silicon substrate and an insulation film formed within the trench; a plurality of element-forming regions configured by a surface region of the silicon substrate and isolated from one another by the element isolation region; and a gate electrode line extending on the element isolation region and the element-forming regions, wherein the surface region of the silicon substrate in the element-forming regions has a height profile as viewed in a direction along the gate electrode line, the height profile being such that the surface region once falls and thereafter rises monotonically as viewed from a boundary between the element-forming regions and the element isolation region toward a center of the element-forming regions.

The present invention provides, in a second aspect thereof a method for manufacturing a semiconductor device including: forming an element isolation region on a silicon substrate to isolate a surface region of the silicon substrate into a plurality of element-forming regions, the isolation region including a trench formed in the silicon substrate and an insulating film deposited therein; removing a surface portion of the insulating film by using an isotropic metric etching process; annealing the silicon substrate in a hydrogen atmosphere to allow the surface region of the silicon substrate in the element-forming regions to have a height profile as viewed in a direction along the gate electrode line, the height profile being such that the surface region once falls and thereafter rises monotonically as viewed from a boundary between the element-forming regions and the element isolation region toward a center of the element-forming regions; and etching back the surface region of the silicon substrate by using an anisotropic etching process.

The above and other objects, features and advantages of the present invention will be more apparent from the following description, referring to the accompanying drawings.

DETAILED DESCRIPTION OF THE EMBODIMENT

Now, an exemplary embodiment of the present invention and a modification thereof will be described with reference to accompanying drawings, wherein similar constituent elements are designated by similar reference numerals throughout the drawings.

Figure 1:
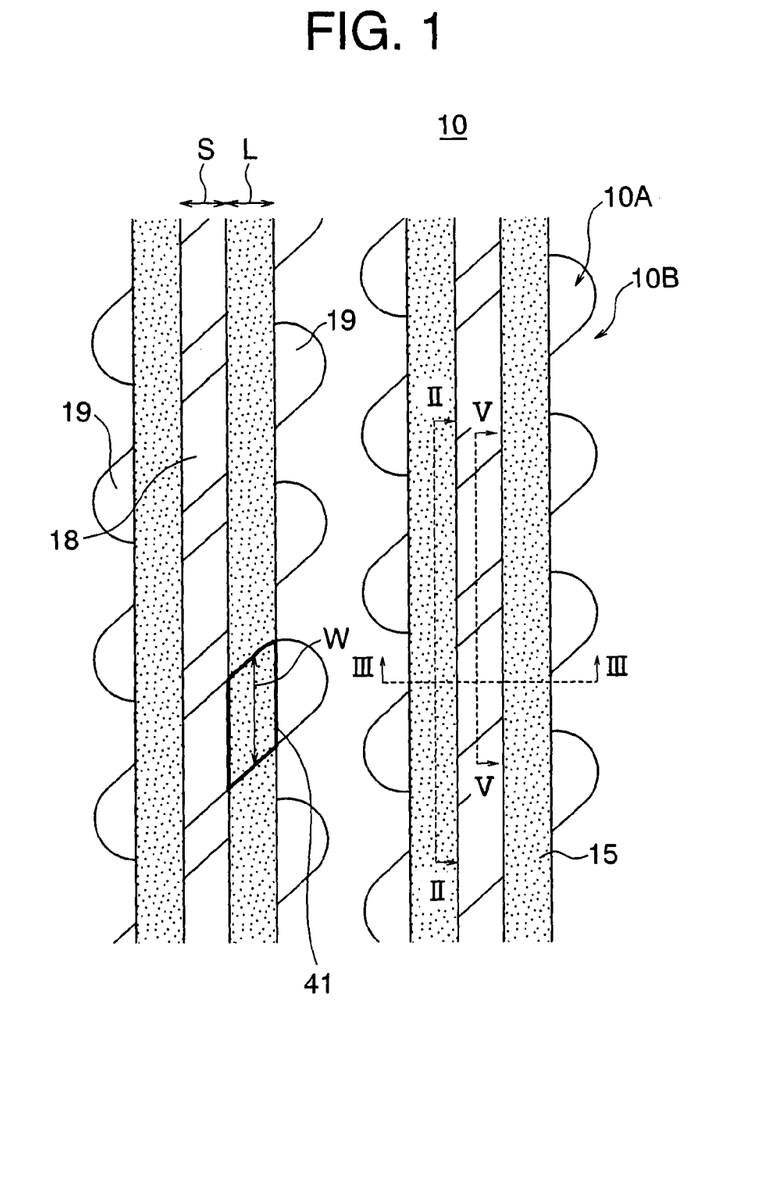
FIG. 1 is a top plan view showing the configuration of a semiconductor device according to an embodiment of the present invention.

FIG. 1 is a top plan view showing part of the cell array area in a DRAM device illustrated as a semiconductor device according to an embodiment of the present invention. The DRAM device, generally designated at numeral 10, has element-forming regions 10A in each of which a pair of MOS transistors are formed and an element-isolating region 10B for isolating the element-forming regions 10A from one another.

Figure 2:
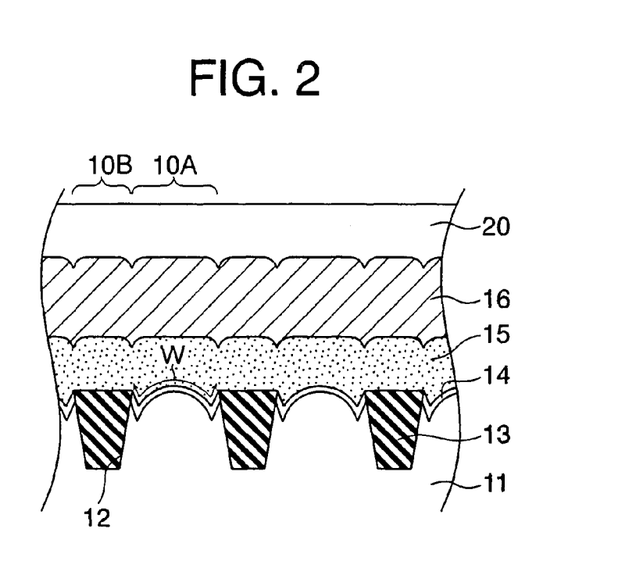
FIG. 2 is a sectional view taken along line II-II in FIG. 1.
Figure 3:
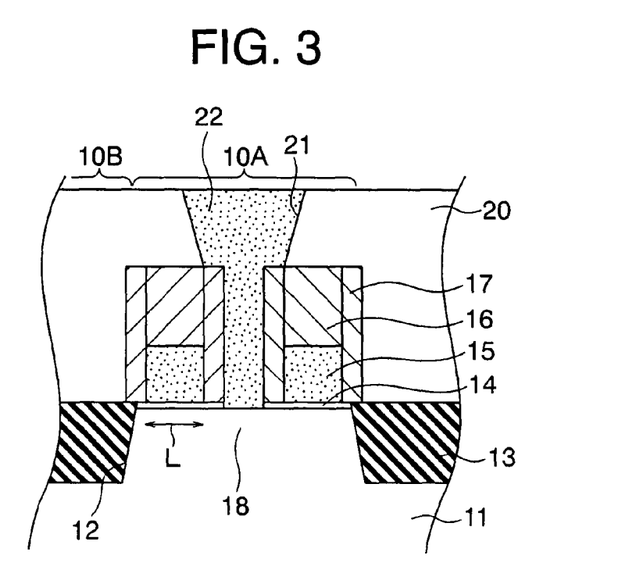
FIG. 3 is a sectional view taken along line III-III in FIG. 1.

FIGS. 2 and 3 are sectional views taken along lines II-II and III-III, respectively, in FIG. 1. The semiconductor device 10 has a silicon substrate 11, and a trench 12 formed in a surface portion of the silicon substrate 11 to configure the element-isolating region 10B. A silicon oxide ($SiO_2$) film 13 is embedded as an isolation oxide film in the trench 12, to configure the element-isolating region 1B of the STI structure.

The surface of the silicon substrate 11 is exposed in the element-forming regions 10A from the STI structure. The exposed silicon surface of the silicon substrate 11 in the element-forming regions 10A extends from a boundary between the exposed silicon surface and the surface of the isolation oxide film 13 in the element isolation region 1B toward the center of the exposed silicon surface while once reducing the height abruptly and then increasing the height moderately. The exposed silicon surface then extends from the center thereof toward the opposing boundary between the exposed silicon surface and the isolation oxide film while moderately reducing the height and then increasing the height abruptly.

In other word, the height profile of the exposed silicon surface in the element forming regions 10A configures a W-character shape, and the central region thereof forms a circular-arc shape. The height profile of the peripheral portion of the exposed silicon surface configures a V-character shape. The height of the center of the exposed silicon surface in the element forming regions 10A is substantially equal to the height of the top surface of the isolation oxide film 13 in the element isolation region 10B.

As shown in FIG. 3, gate oxide films 14 are formed on the exposed surface of the silicon substrate 11, and gate electrodes 15 each configuring a gate electrode line or word line extend on the respective gate oxide films 14. Gate spacers 16 overlie and protect the gate electrodes 15. A sidewall oxide film 17 covers the sidewall of the gate electrodes 15 and gate spacers 16. The gate electrodes 15 are made of, e.g., polysilicon, and the gate spacers 16 and sidewall films 17 are made of, e.g., $Si_3N_4$.

In the structure of FIG. 1, impurities are introduced to the exposed surface portions of the silicon substrate 11, exposed from the gate electrodes 15, to thereby form source regions 18 and drain regions 19 in the element-forming regions 10A The plurality of gate electrodes 15 extend in parallel to each other, and two gate electrodes 15 intersect with a single element-forming region 10A A gate electrode 15, and a source region 18 and a drain region 19 formed on the exposed surface of the silicon substrate 11 at the opposite sides of the gate electrode 15 configure a single MOS transistor. Two MOS transistors are provided in a single element-forming region 10A by sharing the source region 18.

A rhombus region 41, which is defined by a portion of the gate electrode 15 and a portion of the element-forming regions 10A overlapping one another, is the channel region of the MOS transistor extending between the source region 18 and the drain region 19. The length of the channel region 41 along the extending direction of the gate electrode 15 is referred to as the gate width W, with the length of the channel region 41 along the direction perpendicular thereto being referred as the gate length L. The ON-current of the MOS transistor is generally determined by the cross-sectional area of the channel region 41. The gate length L or line width of the gate electrodes 15 is determined in advance by the design rule of the semiconductor device. Therefore, it is desired that the gate width W be increased by a layout design, in order to increase the ON-current of the MOS transistors. In the semiconductor device 10, the line width L and the line space S between adjacent gate electrodes 15 are generally equal and set at 90 nm, for example, in this embodiment.

Turning to FIGS. 2 and 3, an interlayer dielectric film 20 is formed on the silicon substrate 11 so as to cover the gate spacers 16 and sidewall oxide films 17. The interlayer dielectric film 20 is made of BPSG (Boro-Phospho Silicate Glass) or PSG (Phospho Silicate Glass). Contact holes 21 are formed in self-alignment with the sidewall oxide films 17 to expose a surface portion of the silicon substrate 11, penetrating the interlayer dielectric film 20 and gate oxide film 14 between the adjacent two gate electrodes 15.

Figure 4:
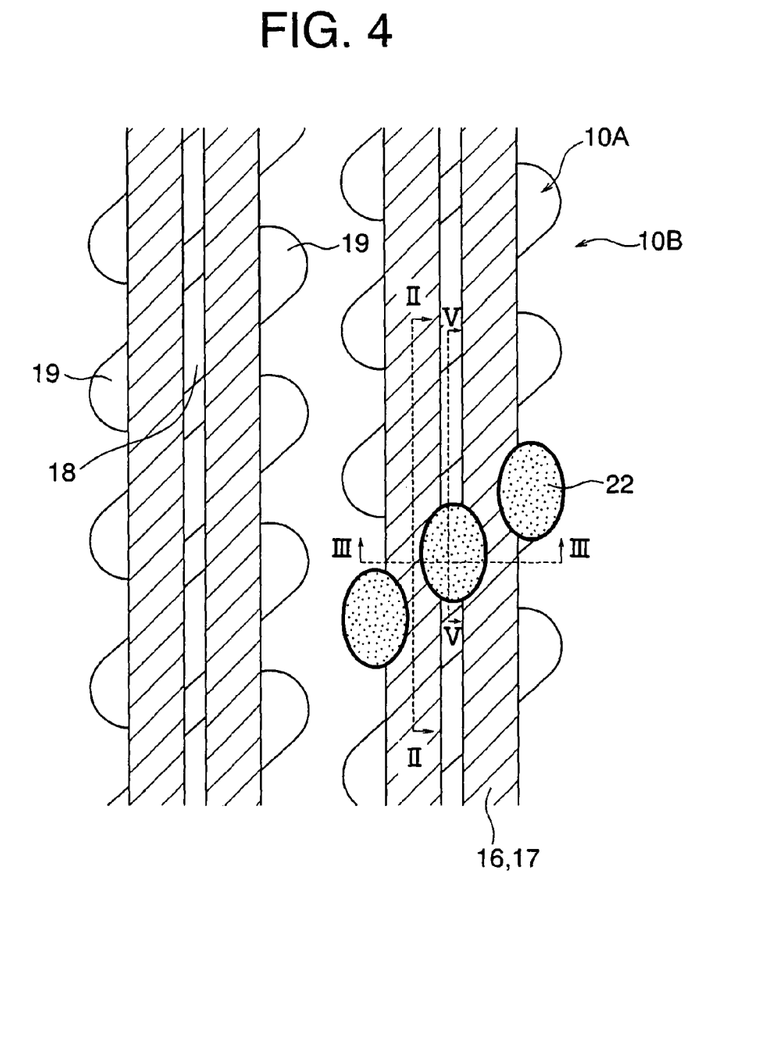
FIG. 4 is a top plan view showing the positional relationship between the contact plugs and some other constituent elements in the semiconductor device of FIG. 1.

Contact plugs 22 made of a conducting material such as impurities-doped polysilicon are formed within the contact holes 21. FIG. 4 is a top plan view showing the positional relationship between the contact plugs 22 provided in a single element-forming region 10A and some other constituent elements of the semiconductor device 10. FIGS. 2 and 3 correspond to the sectional views taken along lines II-II and III-III, respectively, in FIG. 4. The contact plugs 22 are connected to the source region 18 and drain region 19 exposed in the space between the sidewall oxide films 17.

Figure 5:
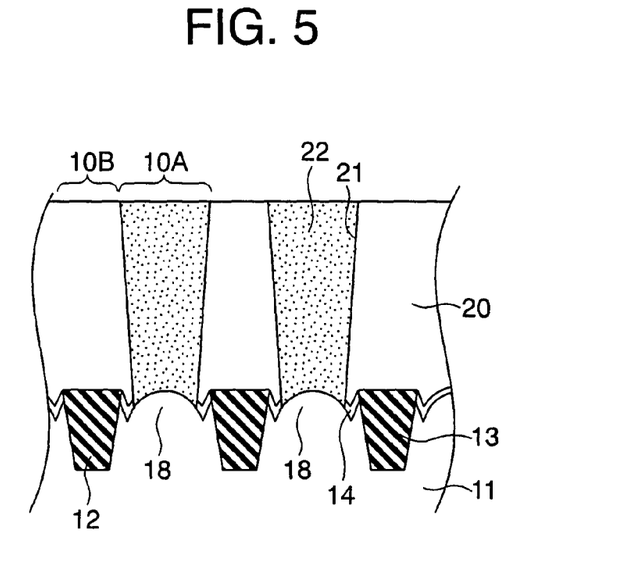
FIG. 5 is a sectional view taken along line V-V in FIG. 4.

FIG. 5 is a sectional view taken along line V-V in FIG. 1 or FIG. 4. Along with the recent reduction in the design rule of the semiconductor device, the contact area between the silicon substrate 11 and the contact plugs 22 is significantly reduced, causing the problem that the contact resistance therebetween tends to increase in the conventional semiconductor. On the other hand, in the semiconductor device 10 of the present embodiment, the contact plugs 22 contact the silicon substrate 11 at the curved surface thereof, to increase the contact area compared to the case of contacting a flat surface of the semiconductor substrate. This may reduce the contact resistance by about 10 to 20% for the contact plugs. The same holds true for the cell array area shown in FIG. 1 in the DRAM device as well as contact plugs formed in the peripheral circuit of the DRAM device. In general, the contact resistance is preferably 1 kΩ or less for the contact plugs.

A single memory cell includes a MOS transistor and a cell capacitor connected to the MOS transistor. The top of the contact plugs 22 is connected to the bottom electrode of the cell capacitor or an overlying interconnection.

In the semiconductor device 10 of the present embodiment, the circular-arc surface of the silicon substrate 11 in the element-forming regions 10A increases the gate width W as understood from FIG. 2. In addition, the contact resistance between the contact plugs and the source region 18 of the MOS transistor is reduced. These facts can improve the characteristic of the MOS transistor to thereby raise the S/N ratio of the DRAM device.

Moreover, a sharp outside corner edge is not formed at the periphery of the silicon surface in the element-forming regions 10A Thus, it is possible, in the dry etching process for forming the gate electrodes 15, to alleviate the concentration of electric field on a specific portion of the gate oxide film 14 formed on the silicon substrate 11. This prevents an over-etching of the gate oxide film 14 on the specific portion. Accordingly, the resultant MOS transistors have a reliable characteristic.

It is to be noted that the conventional LOCOS (Local Oxidation of Silicon)-type element-isolating region is not used in the current semiconductor devices having a design rule of about 0.2 μm or less. This is because it is difficult for the LOCOS structure to achieve smaller dimensions for the element-isolating regions, failing to secure a sufficient gate width. It is thus preferable, in order to secure a sufficient gate width, to form the STI-type element-isolating region as described in the above embodiment.

Figure 6A:
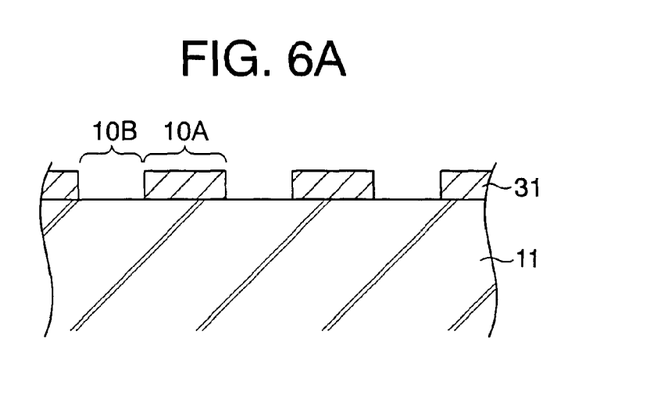
FIGS. 6A to 6G are sectional views showing the consecutive steps of a process for manufacturing the semiconductor device, taken along line II-II in FIG. 1.

FIGS. 6A to 6G are sectional views consecutively showing the steps of a process for manufacturing the semiconductor device shown in FIG. 1. These figures are taken along line II-II in FIG 1. To begin with, a $SiO_2$ film is formed on the silicon substrate 11 by a thermal oxidation process. After depositing a $Si_3N_4$ film on the $SiO_2$ film by using a CVD technique, a photoresist mask is formed on the $Si_3N_4$ film by a photolithographic process. Subsequently, the $Si_3N_4$ film and $SiO_2$ film are patterned by an anisotropic etching technique using the photoresist mask as an etching mask, to form a hard mask 31 having an opening through which the area for the element-isolating region 10B is exposed. Further, by an ashing treatment and a removal process using acid, the photoresist mask is removed (FIG. 6A). In the removal process, sulfuric acid-hydrogen peroxide mixture (SPM) and ammonia-hydrogen peroxide mixture (APM) are used, for example.

Subsequently, by a dry etching technique using the hard mask 31 as an etching mask, a surface portion of the silicon substrate 11 is removed to thereby form a trench 12 in the element-isolating region 10B. In this etching, the taper angle of the trench is set at around 82 to 87 degrees, and the depth is selected at around 200 to 250 nm, for the case of the width of the element-forming regions 10A being 100 nm, fore example. These values are selected in consideration of the filling or embedding performance of the insulating material within the trench 12. The term taper angle as used herein means the angle of the silicon surface of the trench 12 with respect to the vertical direction.

Figure 6B:
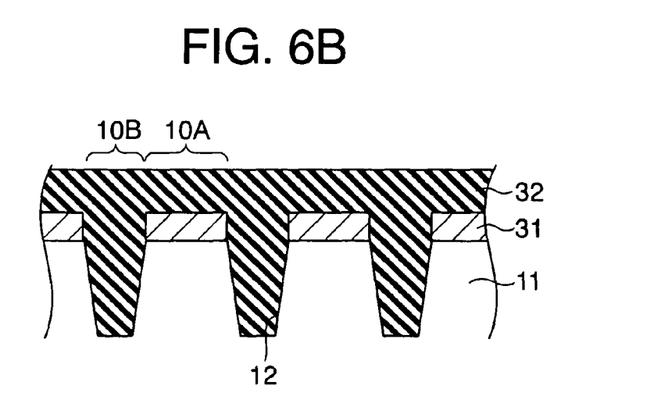
Figure 6C:
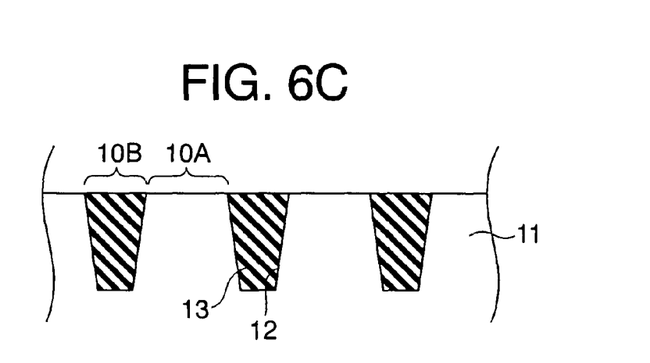

Thereafter, a $SiO_2$ film 32 is deposited within the trench 12 and on top of the silicon substrate 11 by a HDP (High Density Plasma)-CVD technique, for example (FIG. 6B). Thereafter, a CMP (Chemical Mechanical Polishing) or wet processing is used to planarize the surface of the silicon substrate 11, followed by removing the $SiO_2$ film 32 and $Si_3N_4$ film of the hard mask 31 from the silicon substrate 11 (FIG. 6C). The $SiO_2$ film left within of the trench 12 is configured as the isolation oxide film 13.

Figure 6D:
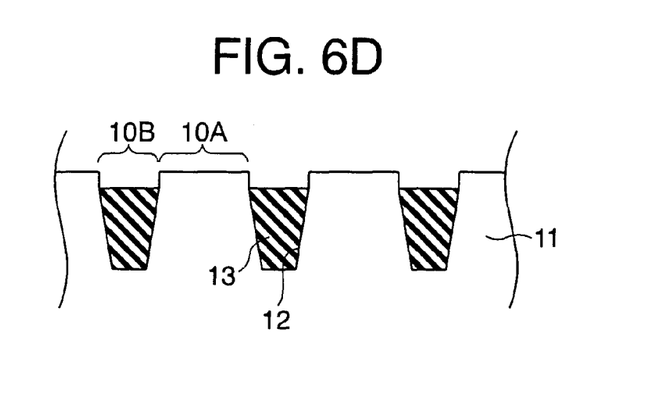

Subsequently, by wet etching using a BHF (buffered HF) solution, which has a high etch selectivity of $SiO_2$ with respect to silicon, a surface portion of the isolation oxide film 13 is removed by around a 20- to 30-nm thickness (FIG. 6D). This allows the top surface of the silicon substrate 11 in the element-forming regions 10A to protrude from the top surface of the isolation oxide film 13 by around 20 to 30 nm.

Figure 6E:
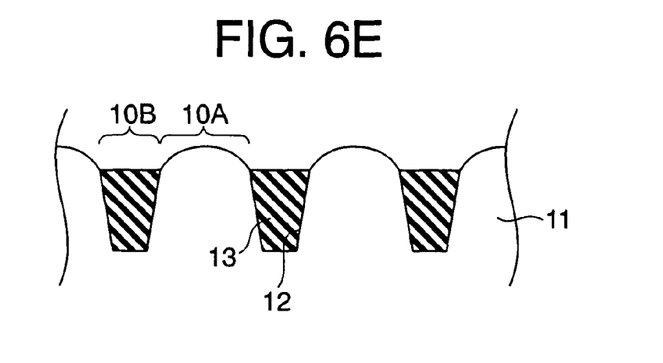

Subsequently, by an annealing treatment in a hydrogen atmosphere, the surface portion of the silicon substrate 11 in the element-forming regions 10A is configured to have a circular-arc profile wherein the surface portion moderately rises from the edge of the element-forming regions 10A toward the center thereof (FIG. 6E). The annealing treatment is typically performed under a pressure of 30 Torr or less, and at a substrate temperature of 900 to 1,000 degrees C. If the substrate temperature is below 900 degrees C., a desired contour of the surface of the silicon substrate 11 may not be obtained, whereas if the substrate temperature is higher than 1,000 degrees C., the silicon substrate 11 may have some warp. An in-line wafer annealer may preferably be used for the annealer, so as to achieve a suitable controllability for the annealing treatment.

In the present embodiment, an ordinary in-line wafer annealer is used, and the pressure is set at 15 Torr, the substrate temperature at 900 degrees C., $H_2$ gas flow rate at 30 slm (standard litter per minute), and treatment time length at 60 sec. The annealing treatment in the hydrogen atmosphere allows the surface of the silicon substrate 11 to be moderately curved. The reason may be that the hydrogen infiltrates into the silicon substrate under a high temperature, to activate the silicon atoms for movement, thereby allowing the surface portion of the silicon substrate 11 to shift to an energetically stable state.

Figure 6F:
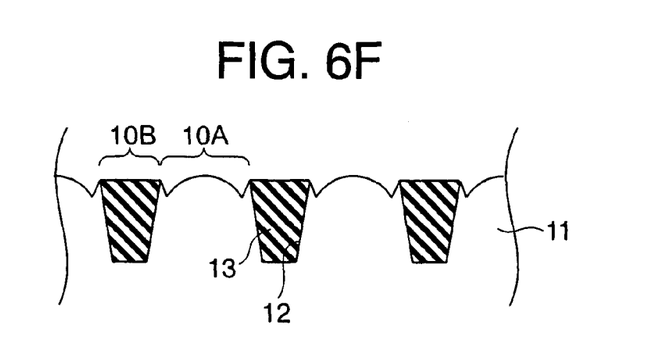

Subsequently, using a dry etching process which provides a high etch selectivity of silicon with respect to $SiO_2$, the surface portion of the silicon substrate 11 in the element-forming regions 10A is etched back by around a 20- to 30-nm thickness while maintaining the original shape. In this process, the height of the central area of the surface portion of the silicon substrate 11, which is exposed most, is leveled with the height of the top surface of the isolation oxide film 13. In addition, the portion of the silicon surface overhanged by the tapered edge of the isolation oxide film 13 remains without being etched. Thus, the surface portion of the silicon substrate 11 has the shape of character-W as shown in FIG. 6F, wherein the silicon surface, as viewed from the edge toward the center thereof, sharply falls to some extent and then moderately rises along a circular-arc curve up to the height equal to the height of top of the isolation oxide film 13. In the present embodiment, an ICP (Induction Coil Plasma) source-etching device having a plasma source of induction coil type is used as an etching device, to perform the following first and second steps.

In the first step, $CF_4$ is used as an etching gas under the conditions of a flow rate of 100 sccm, an ambient pressure of 4 mTorr, a source power of 300 W, a bias power of 100 W, a substrate temperature of 20 degrees C., and an etching time length of 3 seconds. In the second step, HBr and $O_2$ are used as an etching gas under the conditions of HBr flow rate of 150 sccm, $O_2$ flow rate of 4 sccm, ambient pressure of 60 mTorr, source power of 300 W, bias power of 100 W, substrate temperature of 20 degrees C., and etching time length of 20 sec. With these conditions, the etching rate of the silicon is about 60 nm/min., where the etch selectivity of silicon with respect to $SiO_2$ is larger than 200.

Subsequently, by using acid or the like, residual deposits generated by the etch-back process are removed (FIG. 6F). In the removal process, for example, sulfric acid-hydrogen peroxide mixture (SPM) and ammonia-hydrogen peroxide mixture (APM) are used. Thereafter, using a thermal oxidation process, a $SiO_2$ film is formed on the surface of the silicon substrate 11. The portion of the silicon surface having the damages produced by the etch-back process is reacted to form a thermally-oxidized film. Further, by a wet etching process using a BHF solution or the like, the thermally-oxidized film formed on the surface of the silicon substrate 11 is removed, to obtain a silicon surface without a damage on the silicon substrate 11.

Figure 6G:
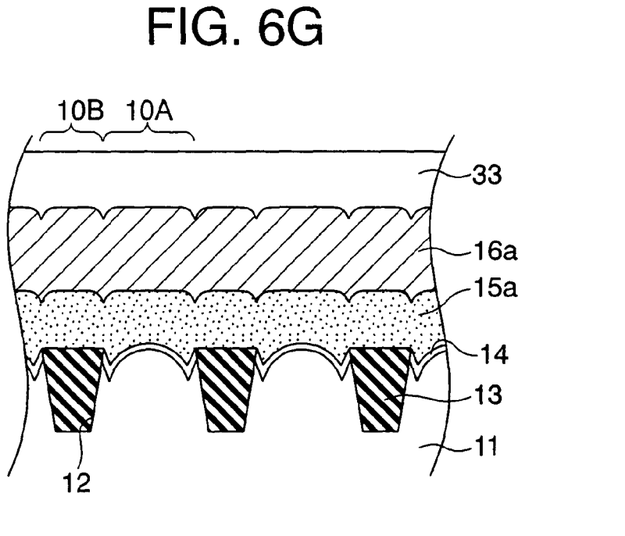

After a gate oxide film 14 is formed on the surface of the silicon substrate 11, an impurities-doped polysilicon film 15a and a $Si_3N_4$ film 16a are consecutively deposited thereon. The $Si_3N_4$ film 16a is formed to have a sufficient thickness for use in a self-alignment process for forming the contact holes 21. Thereafter, a photoresist film 33 is formed on the $Si_3N_4$ film 16a (FIG. 6G). Further, using a known photolithographic technique, the photoresist film 33 is patterned, and a photoresist mask having the pattern of the gate electrodes 15 is formed on the $Si_3N_4$ film 16a.

Subsequently, by a dry etching process using the photoresist mask as an etching mask, the $Si_3N_4$ film 16a is patterned to form the gate spacers 16. Thereafter, by a dry etching process using the gate spacers 16 as an etching mask, the impurities-doped polysilicon film 15a is patterned to form the gate electrodes 15. Thereafter, impurities are injected into the surface portions of the silicon substrate 11 exposed from the gate spacers 16 to form the source regions 18 and drain regions 19. It should be noted that the gate spacers 16 may have a multiple-layer structure such as including a $SiO_2$ film and a $Si_3N_4$ film.

Figure 7:
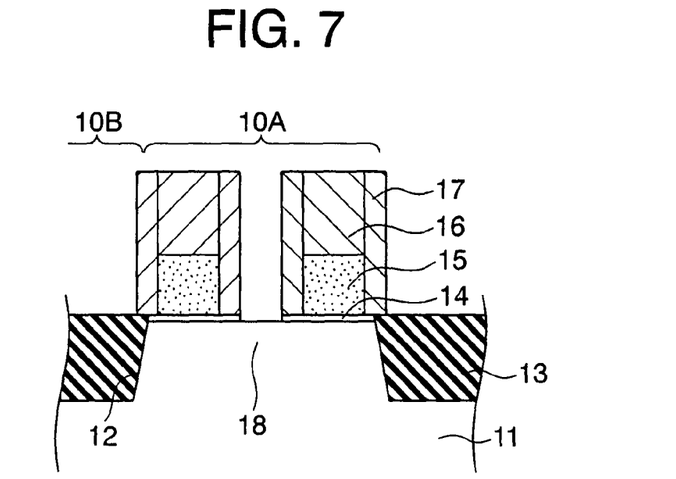
FIG. 7 is a sectional view taken along line III-III in FIG. 1.
Figure 8:
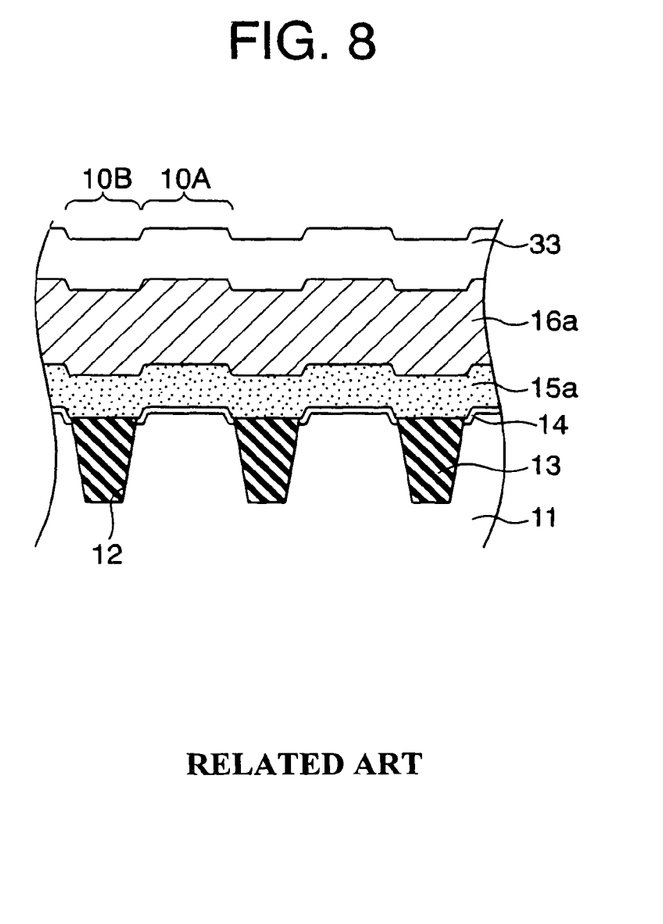
FIG. 8 is a sectional view showing the problem in a conventional technique.

After a $Si_3N_4$ film is deposited to a thickness of about 20 nm on the entire surface, the $Si_3N_4$ film is etched back to a form sidewall oxide film 17 on the sidewall of the gate electrodes 15 and gate spacers 16 overlying the gate oxide film 14. Consequently, MOS transistors including gate electrode 15, and source region 18 and drain region 19 formed on the silicon substrate 11 at both sides of the gate electrode 15 are formed. The structure at this stage is shown in FIG. 7, which is taken along line III-III in FIG. 1.

Thereafter, an interlayer dielectric film 20 having a thickness of 300 to 500 nm is deposited on the silicon substrate 11 to cover the gate spacers 16 and sidewall oxide films 17. The interlayer dielectric film 20 is made of BPSG or PSG Subsequently, the interlayer dielectric film 20 is subjected to an annealing treatment for about 60 min. at a substrate temperature of about 700 to 800 degrees C., thereby suppressing generation of voids in the interlayer dielectric film 20. Further, the top surface of the interlayer dielectric film 20 is polished by a CMP process.

Thereafter, a photoresist mask having a circular-opening pattern is formed on the interlayer dielectric film 20 by using a known photolithographic process. Subsequently, contact holes 21 are formed to expose therethrough the silicon substrate 11 between the sidewall oxide films 17 of adjacent gate electrodes, by a dry etching process using the photoresist mask as an etching mask and also the gate spacers 16 and sidewall oxide films 17 as a self-alignment mask.

Impurity-doped polysilicon is deposited within the contact holes 21 and on top of the interlayer dielectric film 20, followed by a CMP or etch-back process to remove a portion of the doped polysilicon on the interlevel dielectric film 20 and leaving contact plugs 22 within the contact holes 21. Further, capacitors and overlying interconnections are formed to connect to the contact plugs 22, to thereby complete the semiconductor device 10.

According to the method of the present embodiment, subsequent to formation of the element-isolating region 10B, wet etching of the isolation oxide film 13 and an annealing treatment in a hydrogen atmosphere are performed, thereby enabling the exposed surface portion of the silicon substrate 11 in the element-forming regions 10A to have a curved-shape moderately rising from the edge toward the center of the silicon surface. This allows the gate width W of the MOS transistors to be increased as compared to the case of a flat surface of the silicon substrate.

In the method of the present embodiment, the number of exposure processes is not increased compared to the conventional method, in which the surface portion of the silicon substrate is formed flat. As a result, it is possible to suppress a reduction in the throughput of the manufacturing process.

Further, a corner edge or outside corner surface is not formed on the silicon substrate 11 in the element-forming regions 10 Thus, it is possible, in the dry etching process to pattern the gate electrodes 15, to alleviate the concentration of electric field in a specific portion of the gate oxide film 14 formed on the silicon substrate 11, and thus prevent over-etching of the gate oxide film 14. As a result, the reliability of the MOS transistor can be maintained.

In the method described in JP-2001-035913A, during forming the photoresist film 33 used for patterning the gate electrodes 15, as shown in FIG. 7, a step difference or irregularity between the top surface of the silicon substrate 11 in the element-forming regions 10A and the top surface of the isolation oxide film 13 in the element-isolation region 10B reflects the contour of the photoresist film 33. The irregularity of the surface of the photoresist film 33 may cause a range of variation in the focal depth of the exposure light, thereby degrading the dimensional accuracy of the gate electrodes.

On the other hand, in the method of the present embodiment, the silicon substrate 11 is etched back after the annealing treatment, whereby the height in the center of the exposed silicon surface of the silicon substrate 11 in the element-forming regions 10A is substantially equal to the height of the top surface of the isolation oxide film 13. As a result, as shown in FIG. 6G, the reflection of the irregularity of the surface of the photoresist film 33 can be alleviated. This achieves a uniform focal depth of the exposure light thereby improving the dimensional accuracy of the gate electrodes.

Figure 9:
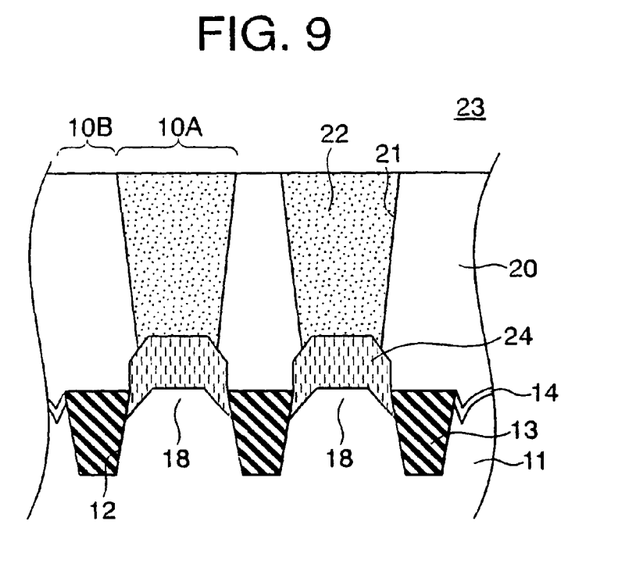
FIG. 9 is a sectional view showing the configuration of a semiconductor device according to a modification of the embodiment.

FIG. 9 shows the configuration of a semiconductor device according to a modified example of the above embodiment. FIG. 9 corresponds to the section shown in FIG. 5. In the semiconductor device, generally designated by numeral 23, a contact layer 24 made of impurities-doped polysilicon is interposed between the silicon substrate 11 and the contact plugs 22. The contact layer 24 increases the contact area between the contact plugs 22 and the silicon substrate.

In manufacturing the semiconductor device 23, after the process of forming the sidewall oxide film such as 17 shown in FIG. 7, impurities-doped polysilicon is grown by an epitaxial growth process on the silicon substrate 11 in the element-forming regions 10A exposed from the gate spacers 16 and sidewall oxide films 17, to form the contact layer 24. During the dry etching process for forming the contact holes 21, the top surface of the contact layer 24 is exposed. In the semiconductor device 23 of this modified example, since the contact area is increased by the presence of the contact layer 24, the contact resistance can be reduced.

Figure 10:
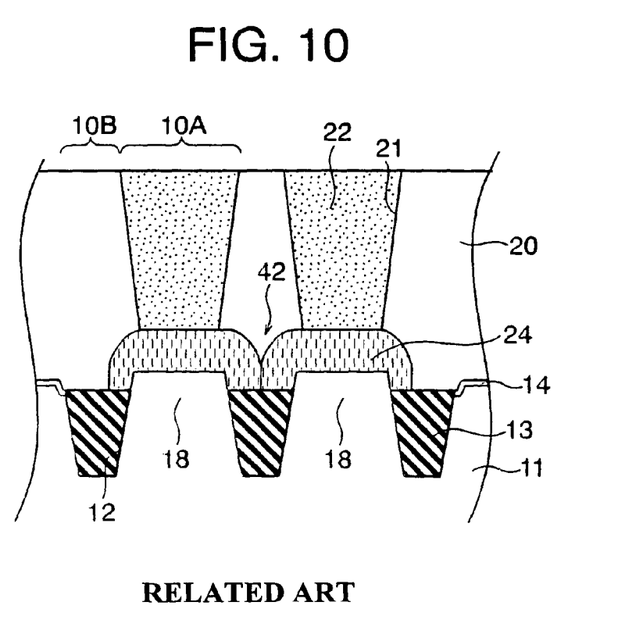
FIG. 10 is a sectional view showing the problem in the conventional technique.

If the contact layer 24 is to be formed in the method described in JP-2001-035913A, as shown in FIG. 10, the contact layer 24 is formed at the location of the step, whereby the contact layer 24 extends outside the element-forming regions 10A toward the element-isolation region 10B. In this case, as represented by the reference numeral 42 in FIG. 12, adjacent two of the contact layers 24 may be in contact with each other, providing the risk of a short circuit failure between the adjacent contact layers 24.

In the modified example, in contrast, since the edge of the exposed surface of the silicon substrate 11 is lower than the top surface of the isolation oxide film 13, the contact layer 24 has an edge within the edge of the surface area of the exposed silicon substrate 11. This can prevent the short-circuit failure from occurring between the adjacent contact layers 24.

In the semiconductor device of the above embodiment of the present invention and the modification, the surface of the silicon substrate in the element-forming region is curved. Therefore, the length of the gate electrode line formed along such a curved surface increases, allowing the gate width of the MOS transistors to be increased. Further, no outside corner edge is formed on the surface portion of the silicon substrate in the element-forming region. Thus, in a dry etching process for patterning gate electrodes, electric field can be suppressed from concentrating on a specific portion of the gate oxide film, thereby preventing an over-etching of the gate insulating film.

While the invention has been particularly shown and described with reference to exemplary embodiments thereof, the invention is not limited to these embodiments. It will be understood by those of ordinary skill in the art that various changes in form and details be made therein without departing from the spirit and scope of the present invention as defined in the claims. For instance, although a DRAM is exemplified in the above embodiment, the present invention is applicable to various types of semiconductor devices including therein MOS transistors.

What is claimed is:

1. A semiconductor device, comprising:
   a silicon substrate;
   an element isolation region including a trench formed in said silicon substrate and an insulation film formed within said trench;
   a plurality of element-forming regions configured by a surface region of said silicon substrate and isolated from one another by said element isolation region; and
   a gate electrode line extending on said element isolation region and said element-forming regions,
   wherein said surface region of said silicon substrate in said element-forming regions includes a height profile as viewed in a direction along said gate electrode line, said height profile being such that said surface region falls in each of the element-forming regions near the trench and thereafter rises monotonically and continuously as viewed from a boundary between said element-forming regions and said element isolation region to a center of said each of the element-forming regions.

2. The semiconductor device according to claim 1, wherein said height profile is such that a height of a center of said surface region is equal to a height of a periphery of said surface region.

3. The semiconductor device according to claim 1, wherein a portion of said surface region that includes a center of the surface region has a shape of a circular arc.

4. The semiconductor device according to claim 1, further comprising:
   a contact plug in contact with said surface region, said contact plug penetrating a space formed between said gate electrode line and another gate electrode line.

5. The semiconductor device according to claim 4, wherein a contact layer is interposed between said contact plug and said surface region, said contact layer having a bottom extending between opposing peripheries of said surface region in said element-forming regions.

6. The semiconductor device according to claim 4, wherein the contact plug contacts the silicon substrate at a curved surface of the center of the surface region.

7. The semiconductor device according to claim 1, wherein an element-forming region of said element-forming regions extends in a direction slanted from said gate electrode line.

8. The semiconductor device according to claim 1, wherein a top surface of the insulation film contacts a lower surface of the gate electrode line.

9. The semiconductor device according to claim 1, wherein the surface region of the silicon substrate comprises a gate oxide film, the gate oxide film being confined between the trench and another trench.

10. The semiconductor device according to claim 1, wherein the height profile comprises a first V-shaped profile in a first periphery of the surface region, a second V-shaped profile in a second periphery of the surface region, and a circular-arc shape profile in a center of the surface region, the circular-arc shape profile extending from the first V-shaped profile to the second V-shaped profile.

11. The semiconductor device according to claim 10, wherein a height of a highest portion of the first V-shaped profile, a highest portion of the second V-shaped profile, and a height of a highest portion of the circular-arc shape profile are equal to the height of a top surface of the insulation film.

12. The semiconductor device according to claim 11, wherein the height profile is confined between the trench and another trench, the first V-shaped profile extending from the trench and the second V-shaped profile extending from the another trench.

13. The semiconductor device according to claim 1, wherein impurities introduced to exposed surface portions of the silicon substrate which are exposed from the gate electrode line and another gate electrode line, parallel to the gate electrode line, form source regions and drain regions in the element-forming regions, the gate electrode line and the another gate electrode line intersecting with one of the element-forming regions.

14. The semiconductor device according to claim 13, wherein one of the source regions and one of the drain regions, formed on one of the exposed surface portions of the silicon substrate at opposite sides of the gate electrode line, are included in a single metal oxide semiconductor (MOS) transistor.

15. The semiconductor device according to claim 14, wherein a rhombus-shaped region, defined by a portion of the gate electrode line and a portion of the element-forming regions overlapping one another, forms a channel region of the MOS transistor that extends between the one of the source regions and the one of the drain regions.

16. The semiconductor device according to claim 15, wherein a length of the channel region along a direction perpendicular to an extending direction of the gate electrode is equal to a line space between the gate electrode line and the another gate electrode line.

17. The semiconductor device according to claim 1, wherein the height profile is such that a height of a center of the surface region is equal to a height of a top surface of the insulation film.

18. A semiconductor device, comprising:
a silicon substrate;
an element isolation region including a trench formed in the silicon substrate and an insulation film formed within the trench;
a plurality of element-forming regions configured by a surface region of the silicon substrate and isolated from one another by the element isolation region; and
a gate electrode line extending on the element isolation region and the element-forming regions,
wherein the surface region of the silicon substrate in the element-forming regions has a height profile as viewed in a direction along the gate electrode line, and
wherein the height profile comprises a first V-shaped profile in a first periphery of the surface region, a second V-shaped profile in a second periphery of the surface region, and a circular-arc shape profile in the center of the surface region, the circular-arc shape profile extending from the first V-shaped profile to the second V-shaped profile,
wherein a top surface of the insulation film abuts a lower surface of the gate electrode line.

19. The semiconductor device according to claim 18, wherein the surface region of the silicon substrate comprises a gate oxide film, the gate oxide film being confined between the trench and another trench, and
wherein an element-forming region of said element-forming regions extends in a direction slanted from said gate electrode line.

20. The semiconductor device according to claim 18, wherein impurities introduced to exposed surface portions of the silicon substrate which are exposed from the gate electrode line and another gate electrode line, parallel to the gate electrode line, form source regions and drain regions in the element-forming regions, the gate electrode line and the another gate electrode line intersecting with one of the element-forming regions,
wherein one of the source regions and one of the drain regions formed on one of the exposed surface portions of the silicon substrate at opposite sides of the gate electrode line are included in a single metal oxide semiconductor (MOS) transistor,
wherein a rhombus-shaped region, defined by a portion of the gate electrode line and a portion of the element-forming regions overlapping one another, forms a channel region of the MOS transistor that extends between the one of the source regions and the one of the drain regions, and
wherein a length of the channel region along a direction perpendicular to an extending direction of the gate electrode is equal to a line space between the gate electrode line and the another gate electrode line.

21. The semiconductor device according to claim 18, wherein a height of a highest portion of the first V-shaped profile, a height of a highest portion of the second V-shaped profile, and a height of a highest portion of the circular-arc shape profile are equal to a height of a top surface of the insulation film.

22. A semiconductor device, comprising:
a silicon substrate;
an element isolation region comprising a pair of trenches formed in the silicon substrate and an insulation film formed within the pair of trenches;
a plurality of element-forming regions configured by a surface region of the silicon substrate and isolated from one another by the element isolation region; and
a gate electrode line extending on the element isolation region and the element-forming regions,
wherein the surface region of the silicon substrate in the element-forming regions has a height profile as viewed in a direction along the gate electrode line,
wherein the height profile comprises a first V-shaped profile in a first periphery of the surface region, a second V-shaped profile in a second periphery of the surface region, and a circular-arc shape profile in the center of the surface region, the circular-arc shape profile extending from the first V-shaped profile to the second V-shaped profile,
wherein a height of a highest portion of the first V-shaped profile, a height of a highest portion of the second V-shaped profile, and a height of a highest portion of the circular-arc shape profile are equal with a height of a top surface of the insulation film,
wherein the top surface of the insulating film abuts a lower surface of the gate electrode line, and
wherein the surface region of the silicon substrate comprises a gate oxide film, the gate oxide film being confined between the pair of trenches,
wherein impurities introduced to exposed surface portions of the silicon substrate which are exposed from the gate electrode line and another gate electrode line, parallel to the gate electrode line, form source regions and drain regions in the element-forming regions, the gate electrode line and the another gate electrode line intersecting with one of the element-forming regions,
wherein one of the source regions and one of the drain regions formed on one of the exposed surface portions of the silicon substrate at opposite sides of the gate electrode line form a single metal oxide semiconductor (MOS) transistor,
wherein a rhombus shaped region, defined by a portion of the gate electrode line and a portion of the element-forming regions overlapping one another, forms a channel region of the MOS transistor that extends between the one of the source regions and the one of the drain regions,
wherein a length of the channel region along a direction perpendicular to an extending direction of the gate electrode is equal to a line space between the gate electrode line and the another gate electrode line, and
wherein an element-forming region of said element-forming regions extends in a direction slanted from said gate electrode line.

* * * * *